(12) United States Patent
Endres et al.

(10) Patent No.: US 10,890,597 B2
(45) Date of Patent: Jan. 12, 2021

(54) WHEEL ROTATIONAL-SPEED SENSOR AND FASTENING SYSTEM FOR MOUNTING A WHEEL ROTATIONAL-SPEED SENSOR

(71) Applicant: Continental Teves AG & Co. oHG, Frankfurt (DE)

(72) Inventors: Ralf Endres, Groß-Gerau (DE); Stephan Jonas, Schwalbach (DE)

(73) Assignee: Continental Teves AG & oHG

( * ) Notice: Subject to any disclaimer, the term of this patent is extended or adjusted under 35 U.S.C. 154(b) by 0 days.

(21) Appl. No.: 16/086,912

(22) PCT Filed: Mar. 27, 2017

(86) PCT No.: PCT/EP2017/057190
§ 371 (c)(1),
(2) Date: Sep. 20, 2018

(87) PCT Pub. No.: WO2017/178215
PCT Pub. Date: Oct. 19, 2017

(65) Prior Publication Data
US 2019/0101563 A1 Apr. 4, 2019

(30) Foreign Application Priority Data
Apr. 15, 2016 (DE) .......... 10 2016 206 389

(51) Int. Cl.
*G01P 1/02* (2006.01)
*G01P 3/487* (2006.01)
(Continued)

(52) U.S. Cl.
CPC .............. *G01P 1/026* (2013.01); *G01D 5/142* (2013.01); *G01D 5/2451* (2013.01); *G01P 3/487* (2013.01); *G01R 33/07* (2013.01)

(58) Field of Classification Search
CPC .... G01R 1/0675; G01R 1/06755; G01R 3/00; G01Q 70/10; G01Q 70/18; G01Q 70/12
See application file for complete search history.

(56) References Cited

U.S. PATENT DOCUMENTS 6,019,086 A   2/2000   Schneider et al.
7,116,101 B1  10/2006  Bear et al.
(Continued)

FOREIGN PATENT DOCUMENTS

CN     102645548 A     8/2012
DE  102005022596 A1   11/2006
(Continued)

OTHER PUBLICATIONS

German Search Report for German Application No. 10 2016 206 389.8, dated Aug. 29, 2016, with partial translation—11 pages.
(Continued)

*Primary Examiner* — Dominic E Hawkins
(74) *Attorney, Agent, or Firm* — RatnerPrestia

(57) ABSTRACT

A wheel rotational-speed sensor for mounting on a vehicle axle, having a sensor housing and a conductor carrier, for example a leadframe, which is arranged in the sensor housing, having a first surface and a second surface facing away from the first surface, wherein a first wheel rotational-speed sensor element for detecting first physical measurement variables is arranged on the first surface of the conductor carrier, and wherein a second wheel rotational-speed sensor element for detecting second physical measurement variables is arranged on the second surface of the conductor carrier. Specifically, the two sensor elements can detect magnetic fields of a magnetic reading track. The sensors can be AMR, GMR or TMR sensors or Hall elements; the two sensors can be structurally identical or of different design.

18 Claims, 4 Drawing Sheets

(51) Int. Cl.
*G01D 5/14* (2006.01)
*G01D 5/245* (2006.01)
*G01R 33/07* (2006.01)

(56) References Cited

U.S. PATENT DOCUMENTS

| | | | |
|---|---|---|---|
| 8,089,233 B2 | 1/2012 | Kanekawa et al. | |
| 8,698,488 B2 | 4/2014 | Lohberg et al. | |
| 9,625,276 B2 | 4/2017 | Ausserlechner | |
| 9,678,174 B2* | 6/2017 | Astegher | G01R 33/07 |
| 9,702,742 B2 | 7/2017 | Reimann | |
| 2007/0172163 A1 | 7/2007 | Yamamoto | |
| 2009/0058407 A1 | 3/2009 | Kanekawa et al. | |
| 2010/0307240 A1* | 12/2010 | Tezuka | G01P 1/00 |
| | | | 73/494 |
| 2011/0167920 A1* | 7/2011 | Rink | G01D 5/2451 |
| | | | 73/760 |
| 2012/0081109 A1 | 4/2012 | Astegher et al. | |
| 2014/0345985 A1* | 11/2014 | Miller | F16D 65/64 |
| | | | 188/79.55 |
| 2015/0105938 A1* | 4/2015 | Seki | B60W 30/18172 |
| | | | 701/1 |
| 2015/0183289 A1* | 7/2015 | Koumura | B60G 17/0161 |
| | | | 701/38 |
| 2015/0198623 A1* | 7/2015 | Dalisdas | G01P 1/00 |
| | | | 701/70 |
| 2016/0025529 A1* | 1/2016 | Astegher | G01L 19/0092 |
| | | | 73/1.15 |
| 2016/0231347 A1* | 8/2016 | Kaufner | G01P 3/487 |

FOREIGN PATENT DOCUMENTS

| | | |
|---|---|---|
| DE | 102010047128 A1 | 4/2012 |
| DE | 202014103355 U1 | 8/2014 |
| DE | 102015101635 A1 | 8/2015 |
| JP | 2014529064 A | 10/2014 |
| KR | 20010097649 A | 11/2001 |

OTHER PUBLICATIONS

International Search Report and Written Opinion for International Application No. PCT/EP2017/057190, dated Jun. 2, 2017, 11 pages.
Chinese Office Action for Chinese Application No. 201780023555.X, dated Apr. 3, 2020, with translation, 17 pages.
Korean Grounds or Rejection for Korean Application No. 10-2018-7029551, dated Aug. 19, 2019, with translation, 15 pages.
Korean Grounds for Final Rejection for Korean Application No. 10-2018-7029551, dated Apr. 3, 2020, with translation, 6 pages.

* cited by examiner

WHEEL ROTATIONAL-SPEED SENSOR AND FASTENING SYSTEM FOR MOUNTING A WHEEL ROTATIONAL-SPEED SENSOR

CROSS REFERENCE TO RELATED APPLICATIONS

This application is the U.S. National Phase Application of PCT International Application No. PCT/EP2017/057190, filed Mar. 27, 2017, which claims priority to German Patent Application No. 10 2016 206 389.8, filed Apr. 15, 2016, the contents of such applications being incorporated by reference herein.

FIELD OF THE INVENTION

The present invention relates to the field of sensor systems in the area of drive technology for vehicles. The invention relates, in particular, to a wheel rotational-speed sensor for mounting on a vehicle axle.

BACKGROUND OF THE INVENTION

Wheel rotational-speed sensors in vehicles deliver signals to control devices of safety systems such as antilock braking systems (ABS) or electronic stability control systems (ESP). Information such as individual wheel rotational speed or a wheel speed of a wheel of the vehicle as well as a vehicle speed can be determined from said signals. Each individual wheel of the vehicle is usually provided with its own wheel rotational-speed sensor. The principle of detection of a wheel rotational speed is generally based on the evaluation of a magnetic signal of an encoder wheel by a magnetosensitive measurement element of the wheel rotational-speed sensor, which encoder wheel is fixedly connected to a wheel axle. The signal of the wheel rotational-speed sensor is transmitted here to the control device (ECU, electronic control unit) by means of a cable connection.

In order to meet the requirements of future safety systems in vehicles, it is necessary to provide each individual wheel with a pair of redundant wheel rotational-speed sensors in order to make it possible for the safety system to reliably intervene in the event of a failure of one of the two wheel rotational-speed sensors. One example of an application of a redundant wheel rotational-speed sensor is highly automated driving. In this case, safety systems such as ABS and ESP have to be embodied in redundant fashion in order that, in the event of a failure of a safety system, it is ensured that, up to the intervention of the driver in the driving situation and beyond, the failure of the safety system does not influence the behavior of the vehicle.

However, providing vehicles with a redundant set of wheel rotational-speed sensors per wheel is expensive and difficult with conventional wheel rotational-speed sensors, since two mounting positions for each wheel rotational-speed sensor have to be provided on the individual wheel, which is generally made difficult by the lack of suitable installation locations. Furthermore, both wheel rotational-speed sensors have to be positioned correctly and as identically as possible with respect to the encoder wheel in order to deliver the most identical signals possible, but this also makes the mounting of the redundant wheel rotational-speed sensors on the wheel difficult.

SUMMARY OF THE INVENTION

An aspect of the present invention aims to provide an efficient concept for a wheel rotational-speed sensor that satisfies the safety requirements of highly automated driving.

The sensor systems and sensor elements presented in the following text can be of different kinds. The individual elements described can be realized by hardware and/or software components, for example electronic components, which can be produced by various technologies and comprise, for example, semiconductor chips, ASICs, microprocessors, digital signal processors, integrated electrical circuits, electro-optical circuits and/or passive component parts.

The solution presented in the following text is based on a rotational-speed sensor having two sensor elements, which can each be electrically contacted separately. The embodiment can be carried out in a housing that is as compact as possible.

According to a first aspect, the invention relates to a wheel rotational-speed sensor for mounting on a vehicle axle, having a sensor housing and a conductor carrier, which is arranged in the sensor housing, wherein the conductor carrier has a first surface and a second surface facing away from the first surface, wherein a first wheel rotational-speed sensor element for detecting first physical measurement variables is arranged on the first surface of the conductor carrier, and a second wheel rotational-speed sensor element for detecting second physical measurement variables is arranged on the second surface of the conductor carrier.

A wheel rotational-speed sensor of this kind meets the safety requirements of autonomous driving, since said wheel rotational-speed sensor comprises two wheel rotational-speed sensor elements, wherein one of the two can function as a redundant sensor. Furthermore, on account of the arrangement of the wheel rotational-speed sensor elements on both sides of the conductor carrier, in particular of a leadframe, said wheel rotational-speed sensor is constructed in a sufficiently compact manner so that it takes up only a little more space than a system having a single wheel rotational-speed sensor element and can therefore be easily attached to the vehicle axle of a vehicle.

According to one embodiment, the wheel rotational-speed sensor elements are designed to detect the physical measurement variables on the basis of an alternating magnetic field of a magnetic reading track, wherein the magnetic reading track is formed by an encoder wheel, which is arranged on the vehicle axle. This achieves the advantage that the wheel rotational speed can be detected efficiently on the basis of the alternating magnetic field of the encoder wheel.

The encoder wheel having the magnetic reading track can comprise a multipole ring, in which magnets with alternating pole direction are used. The surface of the multipole ring facing away from the axle can have or form the reading track. The multipole ring can be used in a sealing ring of a wheel bearing of the vehicle.

When the encoder wheel rotates, the wheel rotational-speed sensor elements of the wheel rotational-speed sensor can detect an alternating magnetic field. The physical measurement variables can comprise measurement variables that are detected by the wheel rotational-speed sensor elements when sections of the reading track having an alternating magnetic pole direction pass by. This alternating signal can be converted to a measurement signal, in particular a digital measurement signal, by an electronics system in the wheel rotational-speed sensor elements (for example an ASIC). The measurement signal can be transmitted to the control device as a current signal, for example in a pulse-width modulation method, in a two-level method or in accordance with a serial data protocol, or as a voltage signal.

According to one embodiment, the first wheel rotational-speed sensor element and the second wheel rotational-speed sensor element each comprise a magnetic sensor element, in particular an AMR sensor element, a GMR sensor element, a TMR sensor element or a Hall sensor element, for detecting the physical measurement variables. This achieves the advantage that the wheel rotational-speed sensor elements can efficiently detect the physical measurement variables.

The magnetic sensor element can be an active or passive electronic component part. The active sensor element permits a larger air gap and reacts even to the smallest changes in the magnetic field so that a very precise wheel rotational-speed measurement can be realized.

According to one embodiment, the first wheel rotational-speed sensor element and the second wheel rotational-speed sensor element each comprise an electrical circuit for processing the physical measurement variables. This achieves the advantage that the wheel rotational-speed sensor elements can be embodied in a flexible manner.

The physical measurement variables of the wheel rotational-speed sensor elements can be processed by the associated electrical circuits and converted, for example, to a digital measurement signal. Furthermore, the measurement variables can be adapted to an interface using a control device. The electrical circuit can also deliver corresponding EMC compatibility of the measurement signal so that corresponding EMC guidelines are met.

According to one embodiment, the magnetic sensor element and the electrical circuit of each wheel rotational-speed sensor element are mounted on the conductor carrier as separate structural components. This achieves the advantage that the wheel rotational-speed sensor elements can be embodied in a flexible manner.

The wheel rotational-speed sensor elements can be operated in this way using different electrical circuits and/or sensor elements, with different functionalities. Changes in the embodiment of the magnetic sensor elements are therefore easier to implement during manufacture of the wheel rotational-speed sensor.

According to one embodiment, the first wheel rotational-speed sensor element is embodied as structurally identical to the second wheel rotational-speed sensor element, or the magnetic sensor element of the first wheel rotational-speed sensor element and the magnetic sensor element of the second wheel rotational-speed sensor element are of different design. This achieves the advantage that a redundant sensor system. In the event of failure of the first wheel rotational-speed sensor element, the second wheel rotational-speed sensor element can take over. Alternatively, both wheel rotational-speed sensor elements can also be operated in parallel in order to achieve a more precise measurement by way of forming the average value.

The magnetic sensor elements can be designed to use different principles of detection. For example, one magnetic sensor element is designed as an AMR sensor element and the other magnetic sensor element is designed as a GMR, TMR or Hall sensor element.

According to one embodiment, the first wheel rotational-speed sensor element and the second wheel rotational-speed sensor element are arranged on an end side of the conductor carrier. This achieves the advantage that the physical measurement variables can be measured in the most precise manner possible. In particular, the first wheel rotational-speed sensor element and the second wheel rotational-speed sensor element are arranged on the same end side of the conductor carrier.

According to one embodiment, the conductor carrier comprises a leadframe, wherein the leadframe is shaped from a metal, in particular copper. The conductor carrier can also comprise a carrier plate, into which the leadframe is embedded.

According to one embodiment, the first wheel rotational-speed sensor element has a first electrical connection for transmitting the first physical measurement variables, and the second wheel rotational-speed sensor element has a second electrical connection for transmitting the second physical measurement variables. This achieves the advantage that the detected physical measurement variables or the measurement signals based on the measurement variables can be transmitted efficiently, for example, to a controller for identification of the wheel rotational speed.

According to one embodiment, the first electrical connection can be connected to a first controller by means of a first conductor arrangement for transmitting the first physical measurement variables, and the second electrical connection can be connected to a second controller by means of a second conductor arrangement for transmitting the second physical measurement variables. This achieves the advantage that the detected physical measurement variables can be transmitted efficiently to the first or second controller for identification of the wheel rotational speed.

The first controller and the second controller can each comprise a processor or a microprocessor. The first controller and the second controller can each be connected to a separate energy source or a common energy source, in particular a vehicle battery, for the purpose of energy supply.

Furthermore, the first controller and the second controller can be identical or the first controller and the second controller can be components of a common controller of the motor vehicle. The controllers can be part of a safety system of the vehicle such as an antilock braking system (ABS) or an electronic stability control system (ESP).

The first conductor arrangement and the second conductor arrangement can each comprise a two-pole electrical connection cable having a voltage supply line and a further line. The further line can serve as a sensor ground. A sensor signal, in particular the physical measurement variables, can be transmitted at the same time via the voltage supply line.

According to one embodiment, the first controller is designed to detect a first wheel rotational speed on the basis of the first physical measurement variables, and the second controller is designed to detect a second wheel rotational speed on the basis of the second physical measurement variables. This achieves the advantage that the controllers can detect the wheel rotational speed independently of one another and only on the basis of the physical measurement variables detected by the associated wheel rotational-speed sensor element. It is therefore not only the wheel rotational-speed sensor elements themselves that are redundant but also the associated controllers.

According to one embodiment, the first conductor arrangement and the second conductor arrangement are encased at least in sections by a common shell. Furthermore, the first conductor arrangement and the second conductor arrangement can be formed at least in sections as a common conductor arrangement. This achieves the advantage that the first conductor arrangement and the second conductor arrangement can be arranged or laid in the vehicle in a space-saving manner.

According to one embodiment, the sensor housing is a plastic housing, in particular an injection-molded housing. This achieves the advantage that the housing can be manufactured in a particularly simple and cost-effective manner. The sensor housing can be formed from PBT (polybutylene terephthalate).

According to one embodiment, the sensor housing is connected to the conductor carrier by means of a materially fixed connection. This achieves the advantage that the sensor housing can be fastened to the conductor carrier in an efficient manner. The housing can be manufactured by means of injection molding. The conductor carrier can comprise sealing elements, which enter into a gas-tight and liquid-tight connection with the sensor housing during injection molding of the sensor housing.

According to a second aspect, the invention relates to a fastening system for mounting a wheel rotational-speed sensor on a vehicle axle of a vehicle, wherein the wheel rotational-speed sensor comprises a sensor housing and a conductor carrier, which is arranged in the sensor housing, wherein the conductor carrier has a first surface and a second surface facing away from the first surface, wherein a first wheel rotational-speed sensor element for detecting first physical measurement variables is arranged on the first surface of the conductor carrier, and wherein a second wheel rotational-speed sensor element for detecting second physical measurement variables is arranged on the second surface of the conductor carrier, wherein an encoder wheel having a magnetic reading track is also arranged on the vehicle axle, and wherein the fastening system comprises a fastening adapter, which can be mounted on the vehicle axle, wherein the fastening adapter comprises a receptacle for receiving the sensor housing, wherein the receptacle is designed to align the first wheel rotational-speed sensor element and the second wheel rotational-speed sensor element in the direction of the magnetic reading track in order to detect the respective physical measurement variables. This achieves the advantage that the wheel rotational-speed sensor can be fastened to the vehicle axle efficiently and alignment with the magnetic reading track can take place.

According to one embodiment, the receptacle is shaped as a recess or aperture in the fastening adapter, wherein the sensor housing can be inserted into the recess or the aperture.

According to one embodiment, the fastening adapter comprises a flange for mounting, in particular for screw mounting, of the fastening adapter to the vehicle axle, in particular to an axle journal. This achieves the advantage that the fastening adapter can be attached to the vehicle efficiently. The fastening adapter can take place, for example, at a wheel bearing of the vehicle.

The invention can be realized in hardware and/or software.

BRIEF DESCRIPTION OF THE DRAWINGS

Further exemplary embodiments are explained in more detail with reference to the appended figures. In the figures.

DETAILED DESCRIPTION OF THE PREFERRED EMBODIMENTS

In the following detailed description, reference is made to the accompanying drawings, which form a part thereof and which show, as an illustration, specific embodiments in which the invention can be carried out. It goes without saying that other embodiments can also be used and structural or logical changes can be made without departing from the concept of the present invention. The following detailed description should therefore not be understood in a restrictive sense. It also goes without saying that the features of the various exemplary embodiments described herein can be combined with one another unless specifically stated otherwise.

The aspects and embodiments are described with reference to the drawings, wherein identical reference signs generally relate to identical elements. Numerous specific details are stated in the following description for the purposes of explanation in order to provide an in-depth understanding of one or more aspects of the invention. However, it may be obvious to a person skilled in the art that one or more aspects or embodiments can be implemented with a lower degree of the specific details. In other cases, known structures and elements are illustrated in a schematic form in order to facilitate the description of one or more aspects or embodiments. It goes without saying that other embodiments can be used and structural or logical changes can be made without departing from the concept of the present invention.

Even though a particular feature or a particular aspect of an embodiment may have been disclosed with respect to only one of a plurality of implementations, such a feature or such an aspect can also be combined with one or more other features or aspects of the other implementations, as may be desirable and advantageous for a given or particular application. Furthermore, to the extent to which the expressions "contain", "have", "having" or other variants thereof are used either in the detailed description or in the claims, such expressions are intended to be inclusive in a manner similar to the expression "comprise". The expressions "coupled" and "connected" may have been used together with derivatives thereof. It goes without saying that such expressions are used to state that two elements cooperate or interact with one another irrespective of whether they are in direct physical or electrical contact or are not in direct contact with one another. In addition, the expression "by way of example" should be interpreted only as an example instead of denoting the best or optimum case. The following description should therefore not be understood in a restrictive sense.

Figure 1:
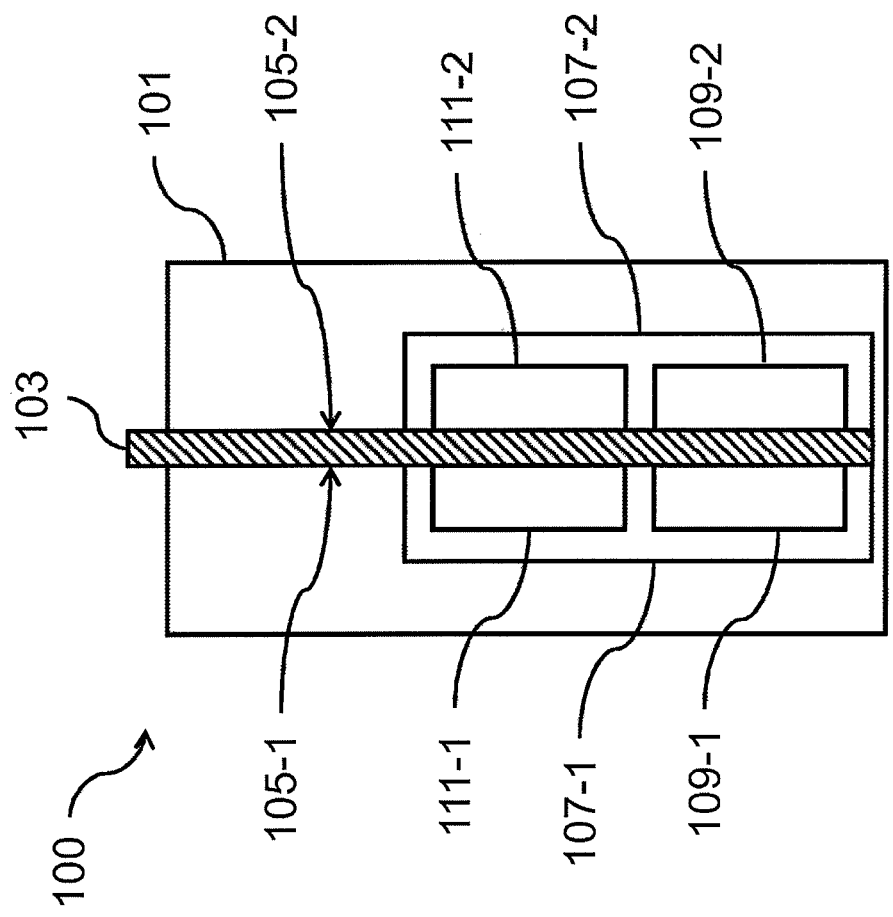
FIG. 1 shows a schematic illustration of a wheel rotational-speed sensor.

FIG. 1 shows a schematic illustration of a wheel rotational-speed sensor 100 according to one embodiment.

The wheel rotational-speed sensor 100 comprises a sensor housing 101 and a conductor carrier 103, which is arranged in the sensor housing 101, wherein the conductor carrier 103 has a first surface 105-1 and a second surface 105-2 facing away from the first surface 105-1, wherein a first wheel rotational-speed sensor element 107-1 for detecting first physical measurement variables is arranged on the first surface 105-1 of the conductor carrier 103, and wherein a second wheel rotational-speed sensor element 107-2 for detecting second physical measurement variables is arranged on the second surface 105-2 of the conductor carrier 103.

A wheel rotational-speed sensor 100 of this kind meets the safety requirements of autonomous driving, since said wheel rotational-speed sensor comprises two wheel rotational-speed sensor elements 107-1, 107-2, wherein one of the two can function as a redundant sensor. Furthermore, on account of the arrangement of the wheel rotational-speed sensor elements 107-1, 107-2 on both sides of a conductor carrier 103, said wheel rotational-speed sensor is constructed in a sufficiently compact manner so that it takes up only a little more space than a system having a single wheel rotational-speed sensor element and can therefore be easily attached to the vehicle axle of a vehicle in order to determine the rotational speed of the corresponding wheel there and to transmit it to a control device, for example.

The first wheel rotational-speed sensor element 107-1 and the second wheel rotational-speed sensor element 107-2 can comprise a first magnetic sensor element 109-1 and a second magnetic sensor element 109-2, respectively, for detecting the physical measurement variables. The first magnetic sensor element 109-1 and the second magnetic sensor element 109-2 can each comprise an AMR sensor element, a GMR sensor element, a TMR sensor element or a Hall sensor element. The magnetic sensor elements 109-1, 109-2 can be active or passive electronic component parts.

Common physical measurement principles such as AMR (anisotropic magnetoresistance effect), GMR (giant magnetoresistance effect), TMR (tunnel magnetoresistance effect) and Hall can therefore be applied to detect the physical measurement variables.

The first wheel rotational-speed sensor element 107-1 and the second wheel rotational-speed sensor element 107-2 can furthermore comprise a first electrical circuit 111-1 and a second electrical circuit 111-2, respectively, for processing the physical measurement variables.

The electrical circuits 111-1, 111-2 can process the physical measurement variables of the wheel rotational-speed sensor elements 107-1, 107-2 and convert them, for example, to a digital measurement signal. Furthermore, the electrical circuits 111-1, 111-2 can adjust the measurement variables to an interface using a control device. The electrical circuits 111-1, 111-2 can also deliver corresponding EMC compatibility of the measurement signal so that corresponding EMC guidelines are met.

The electrical circuits 111-1, 111-2 can be designed as an integrated circuit on the conductor carrier 103.

According to one embodiment, the magnetic sensor element 109-1, 109-2 and the electrical circuit 111-1, 111-2 of each wheel rotational-speed sensor element 107-1, 107-2 are mounted on the conductor carrier 103 as separate structural components.

The wheel rotational-speed sensor elements 107-1, 107-2 can be operated in this way using different electrical circuits 111-1, 111-2 and/or sensor elements 109-1, 109-2 with different functionalities. Changes in the embodiment of the magnetic sensor elements 109-1, 109-2 are therefore easier to implement during manufacture of the wheel rotational-speed sensor 100.

According to a further embodiment, the magnetic sensor element 109-1, 109-2 and the associated electrical circuit 111-1, 111-2 of each wheel rotational-speed sensor element 107-1, 107-2 are integrated on a common chip or are implemented as a common chip.

According to one embodiment, the first wheel rotational-speed sensor element 107-1 is embodied as structurally identical to the second wheel rotational-speed sensor element 107-2 in order to provide a redundant sensor system. In the event of failure of the first wheel rotational-speed sensor element 107-1, the second wheel rotational-speed sensor element 107-2 can take over. Alternatively, both wheel rotational-speed sensor elements 107-1, 107-2 can also be operated in parallel in order to achieve a more precise measurement by way of forming the average value.

According to a further embodiment, however, the magnetic sensor element 109-1 of the first wheel rotational-speed sensor element 107-1 and the magnetic sensor element 109-2 of the second wheel rotational-speed sensor element 107-2 can be of different design.

Different detection principles (for example AMR-GMR, GMR-Hall) can therefore be used in a wheel rotational-speed sensor 100 in order to reduce or to prevent the occurrence of faults that are caused by one of the detection principles.

According to one embodiment, the first wheel rotational-speed sensor element 107-1 and the second wheel rotational-speed sensor element 107-2 are each arranged on an end side of the conductor carrier 103, in particular an end side that faces toward a magnetic reading track.

The conductor carrier 103 can comprise a leadframe. The leadframe can be comb-shaped or frame-shaped and can be shaped from a metal, in particular copper.

The sensor housing 101 can comprise an injection-molded housing composed of a plastic such as PBT. The wheel rotational-speed sensor elements 107-1, 107-2, in particular the magnetic sensor elements 109-1, 109-2 and the electrical circuits 111-1, 111-2 can be covered in an epoxy layer or be surrounded by an epoxy layer. The sensor housing 101 can be produced by means of an injection-molding process and can be connected in a materially bonded manner to the conductor carrier 103.

Figure 2A:
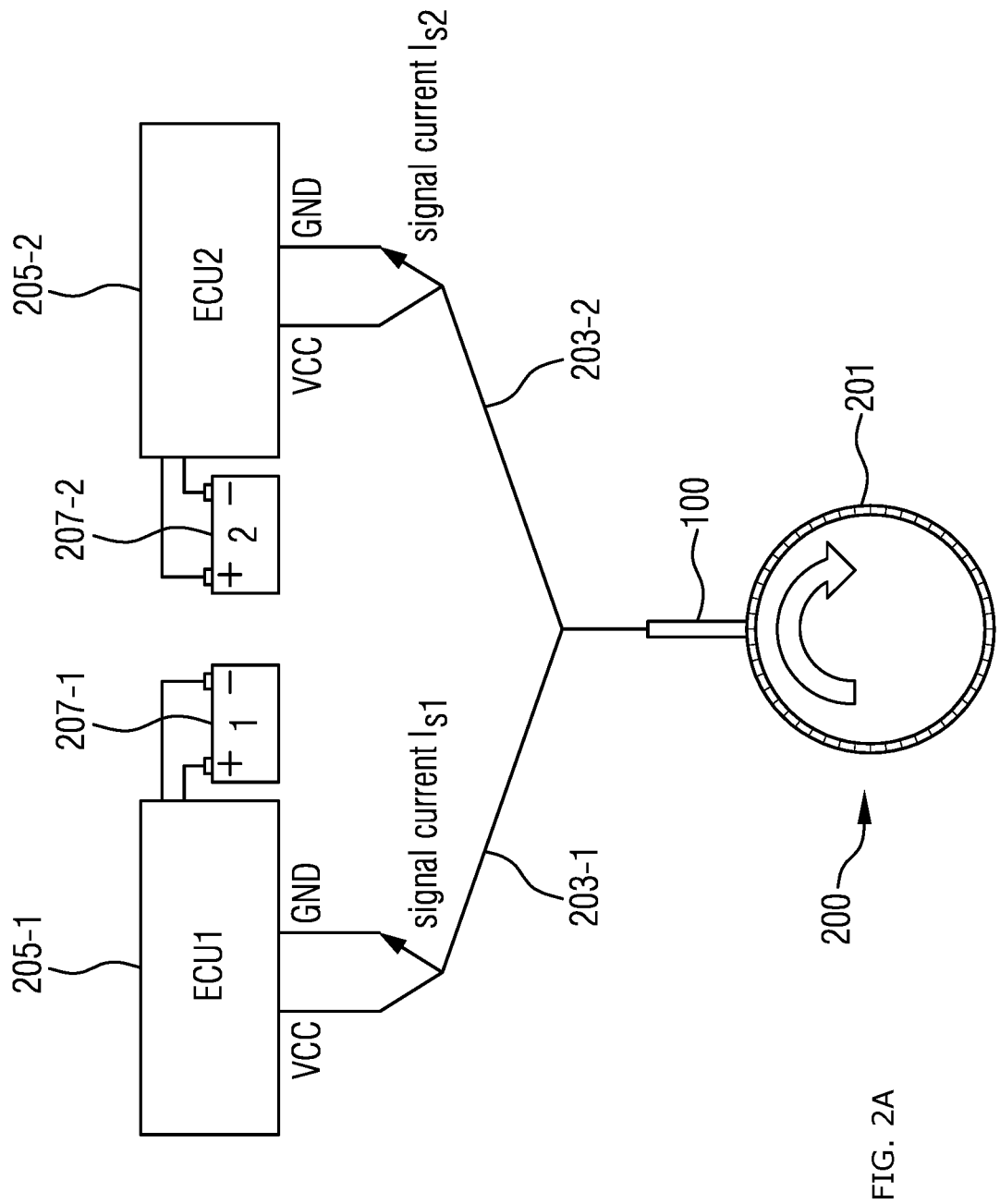
FIG. 2A shows a schematic illustration of a wheel rotational-speed sensor on an encoder wheel.

FIG. 2A shows a schematic illustration of a wheel rotational-speed sensor 100 on the encoder wheel 200 according to one embodiment.

The encoder wheel 200 can comprise a multipole ring, in which magnets with alternating pole direction are used. The surface of the multipole ring facing away from the axle can form the reading track 201. The multipole ring can be used in a sealing ring of a wheel bearing of the vehicle.

In FIG. 2A, the wheel rotational-speed sensor 100 is connected to a first controller 205-1 by means of a first conductor arrangement 203-1 and to a second controller 205-2 by means of a second conductor arrangement 203-2.

The first wheel rotational-speed sensor element 107-1 can have a first electrical connection for transmitting the first physical measurement variables, and the second wheel rotational-speed sensor element 107-2 can have a second electrical connection for transmitting the second physical measurement variables.

The first electrical connection can be connected to the first controller 205-1 by means of the first conductor arrangement 203-1 for transmitting the first physical measurement variables. Furthermore, the second electrical connection can be connected to the second controller 205-2 by means of the second conductor arrangement 203-2 for transmitting the second physical measurement variables.

The first controller 205-1 and the second controller 205-2 can each comprise a processor or a microprocessor. The first controller 205-1 and the second controller 205-2 can be connected to a first energy source 207-1 and to a second energy source 207-2, respectively, or to a common energy source, in particular a vehicle battery, for the purpose of energy supply.

The first conductor arrangement 203-1 and the second conductor arrangement 203-2 can each comprise a two-pole electrical connection cable having a voltage supply line and a further line. The further line can serve as a sensor ground. A sensor signal or measurement signal, in particular the physical measurement variables, can be transmitted at the same time to the appropriate controller 205-1, 205-2 via the voltage supply line.

According to one embodiment, the first conductor arrangement 203-1 and the second conductor arrangement 203-2 are encased at least in sections by a common shell.

The first conductor arrangement 203-1 and the second conductor arrangement 203-2 can therefore be arranged or laid in a common wheel sensor cable in the vehicle in a space-saving manner. The wheel rotational-speed sensor elements 107-1, 107-2 can be connected to the wheel sensor cable on both surfaces 105-1, 105-2 of the conductor carrier 103 separately from one another.

The first controller 205-1 can be designed to detect a first wheel rotational speed on the basis of the first physical measurement variables. Furthermore, the second controller 205-2 can be designed to detect a second wheel rotational speed on the basis of the second physical measurement variables.

The first controller 205-1 and the second controller 205-2 can be part of a control device of the vehicle. The control device can be assigned to a safety system, such as an antilock braking system (ABS) or an electronic stability control system (ESP), for example. The control device can detect the first wheel rotational speed and the second wheel rotational speed and form an average value of the wheel rotational speeds, for example. Furthermore, in the event of a failure of one wheel rotational-speed sensor element 107-1, 107-2 and/or of the associated controller 205-1, 205-2, the control device can detect the wheel rotational speed on the basis of the measurement signal of the other wheel rotational-speed sensor element 107-1, 107-2.

Figure 2B:
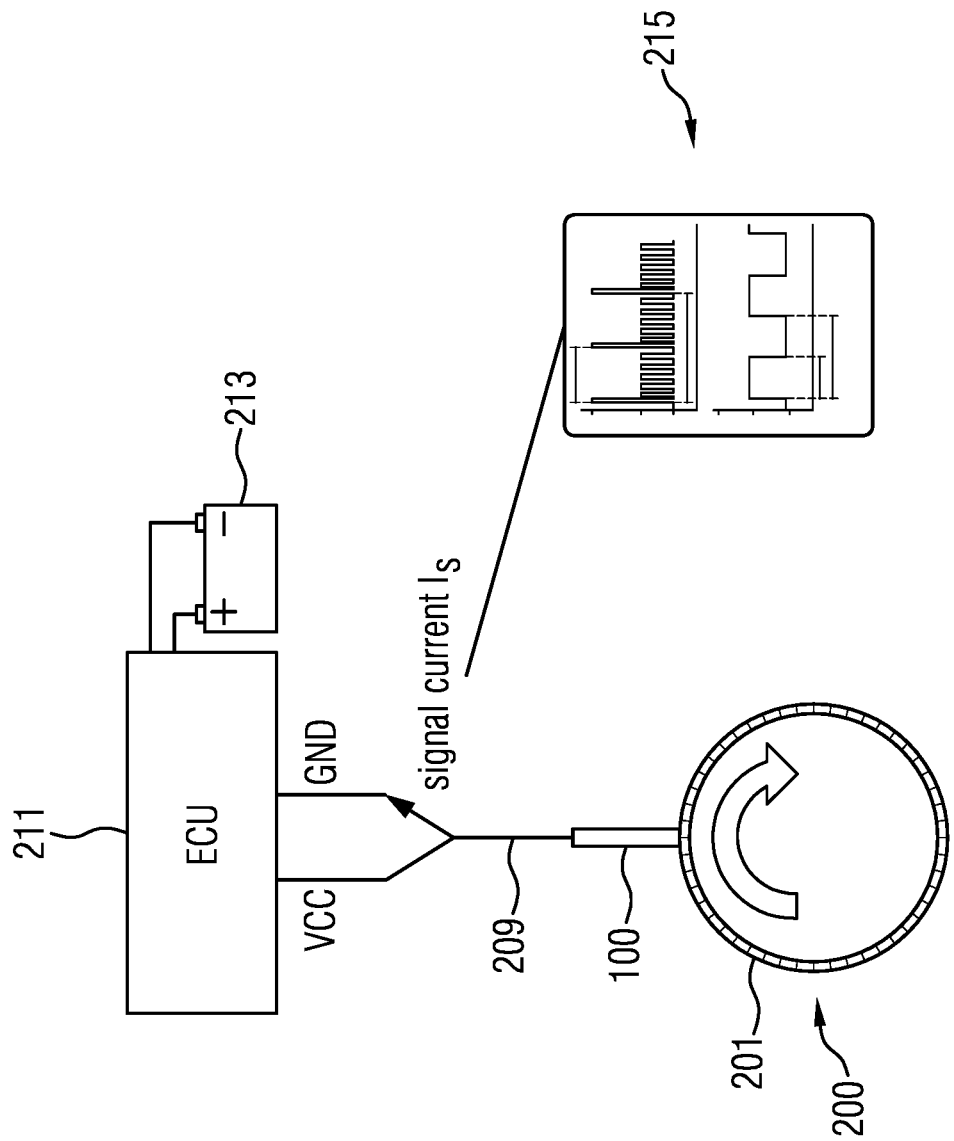
FIG. 2B shows a schematic illustration of a wheel rotational-speed sensor on an encoder wheel.

FIG. 2B shows a schematic illustration of the wheel rotational-speed sensor 100 on the encoder wheel 200 according to a further embodiment.

FIG. 2B shows just one conductor arrangement 209, which connects the wheel rotational-speed sensor 100 to a controller 211 having a connected energy source 213. A measurement signal 215 is transmitted from the wheel rotational-speed sensor 100 to the controller 211 by means of the conductor arrangement 209.

When the encoder wheel 200 rotates, the wheel rotational-speed sensor elements 107-1, 107-2 of the wheel rotational-speed sensor 100 can detect an alternating magnetic field. The physical measurement variables can comprise physical measurement variables that are detected by the wheel rotational-speed sensor elements 107-1, 107-2 when sections of the reading track 201 having an alternating magnetic pole direction pass by. This alternating signal can be converted to a measurement signal 215, in particular a digital measurement signal, by an electronics system in the wheel rotational-speed sensor elements 107-1, 107-2 (for example an ASIC). The measurement signal 215 can be transmitted to the controller 211 as a current signal, for example in a pulse-width modulation method, in a two-level method or in accordance with a serial data protocol, or as a voltage signal.

Figure 3:
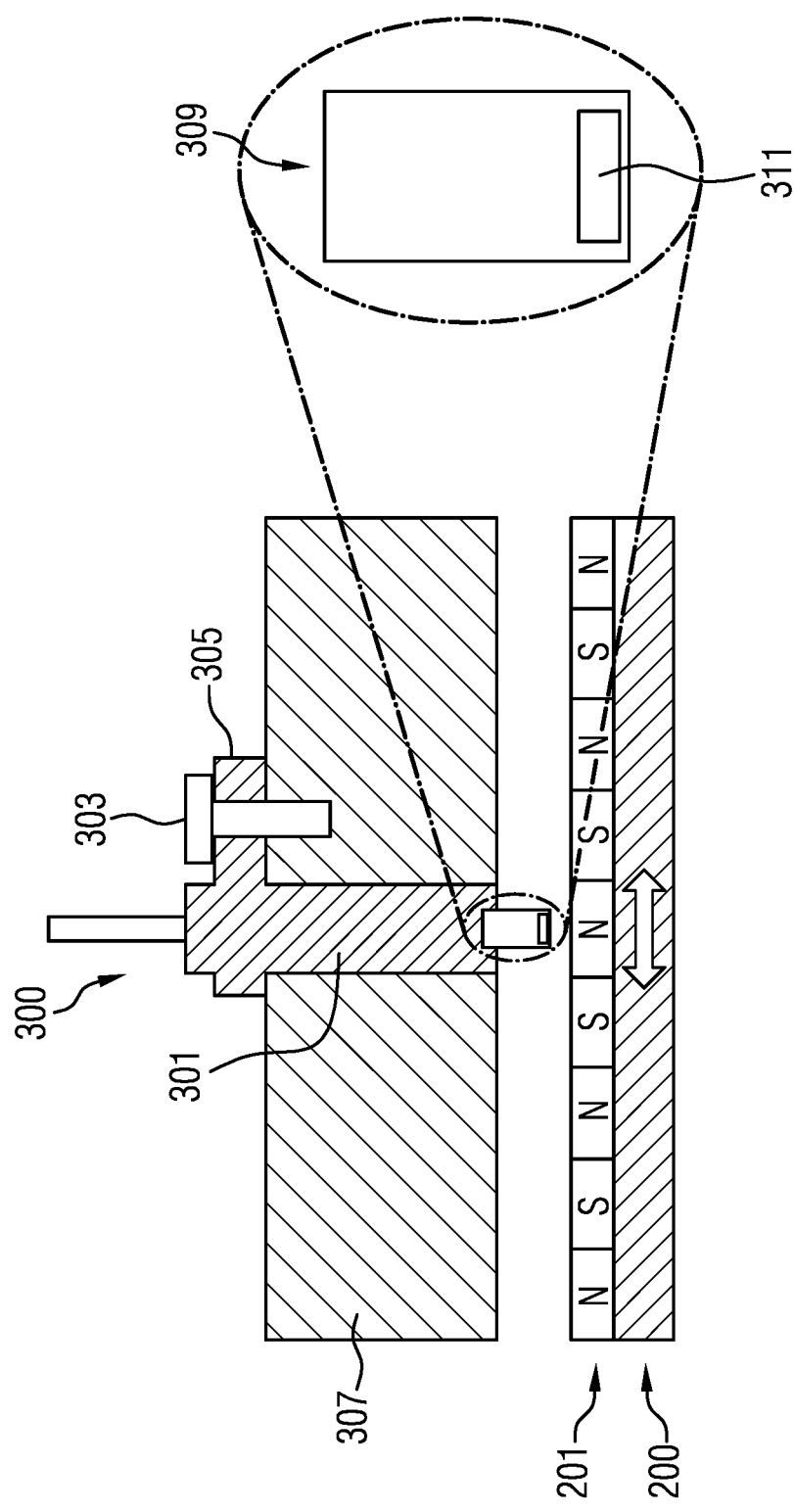
FIG. 3 shows a schematic illustration of a fastening system for a wheel rotational-speed sensor.

FIG. 3 shows a schematic illustration of a fastening system 300 for the wheel rotational-speed sensor 100 having a fastening adapter 301 according to one embodiment.

The fastening system 300 in FIG. 3 is mounted on a vehicle axle of a vehicle, wherein an encoder wheel 200 having a magnetic reading track 201 is arranged on the vehicle axle.

The fastening system 300 comprises a fastening adapter 301, which can be mounted on an axle journal 307 on the vehicle axle, wherein the fastening adapter 301 comprises a receptacle for receiving the sensor housing (not shown in FIG. 3), and wherein the receptacle is designed to align the wheel rotational-speed sensor perpendicularly to the magnetic reading track 201.

The receptacle can be shaped as a recess or aperture in the fastening adapter 301. The sensor housing 101 can be insertable into the recess or the aperture.

The fastening adapter 301 in FIG. 3 comprises a flange 305 for mounting the fastening adapter on the axle journal 307. The flange can in this case be fastened to the axle journal 307 by means of a fastening screw 303.

The wheel rotational-speed sensor 309 comprises a first and a second wheel rotational-speed sensor element on two opposite surfaces of the conductor carrier of the wheel rotational-speed sensor 309, wherein FIG. 3 shows just one wheel rotational-speed sensor element 311 on a surface side. The first and the second wheel rotational-speed sensor element can be arranged on that end side of the wheel rotational-speed sensor 309 that faces toward the magnetic reading track 201 in the case of fastening of the wheel rotational-speed sensor 309 in the fastening adapter 301.

A substantial advantage of the concept of a redundant wheel rotational-speed sensor 100 presented here is that, despite the redundant embodiment of the wheel rotational-speed sensor elements, the space requirement of the wheel rotational-speed sensor 100 is not or is only marginally increased so that existing installation concepts can continue to be followed.

In particular, due to the redundant attachment of the wheel rotational-speed sensor elements 107-1, 107-2 on the conductor carrier 103, the attachment of the wheel rotational-speed sensor 100 in an application-specific holder for correctly positioning the measurement elements is not additionally made difficult in comparison with a conventional wheel rotational-speed sensor.

Furthermore, due to the redundant attachment of the wheel rotational-speed sensor elements 107-1, 107-2 in the wheel rotational-speed sensor 100, there is no increased space requirement for the wheel rotational-speed sensor 100 in comparison with a conventional wheel rotational-speed sensor having a wheel rotational-speed sensor element. The wheel rotational-speed sensor 100 having the redundant wheel rotational-speed sensor elements 107-1, 107-2 can therefore be installed at the same installation position in the vehicle as a conventional wheel rotational-speed sensor having just one wheel rotational-speed sensor element.

LIST OF REFERENCE SIGNS

100 Wheel rotational-speed sensor
101 Sensor housing
103 Conductor carrier
105-1 First surface
105-2 Second surface
107-1 First wheel rotational-speed sensor element
107-2 Second wheel rotational-speed sensor element
109-1 First magnetic sensor element
109-2 Second magnetic sensor element
111-1 First electrical circuit
111-2 Second electrical circuit
200 Encoder wheel
201 Magnetic reading track
203-1 First conductor arrangement
203-2 Second conductor arrangement
205-1 First controller
205-2 Second controller
207-1 First energy source
207-2 Second energy source
209 Conductor arrangement
211 Controller
213 Energy source
215 Measurement signal
300 Fastening system
301 Fastening adapter 303 Fastening screw
305 Flange
307 Axle journal
309 Wheel rotational-speed sensor
311 Wheel rotational-speed sensor element

The invention claimed is:

1. A wheel rotational-speed sensor for mounting on a vehicle axle, comprising:
a sensor housing; and
a conductor carrier, which is arranged in the sensor housing, wherein the conductor carrier has a first surface and a second surface facing away from the first surface, the first surface and the second surface bounded at least in part by an end side of the conductor carrier;
wherein a first wheel rotational-speed sensor element for detecting first physical measurement variables is arranged on the first surface of the conductor carrier, and wherein a second wheel rotational-speed sensor element for detecting second physical measurement variables is arranged on the second surface of the conductor carrier, and wherein the first wheel rotational-speed sensor element and the second wheel rotational-speed sensor element are arranged on the end side of the conductor carrier.

2. The wheel rotational-speed sensor as claimed in claim 1, wherein the first and second wheel rotational-speed sensor elements detect the physical measurement variables on the basis of an alternating magnetic field of a magnetic reading track, wherein the magnetic reading track is formed by an encoder wheel (200), which is arranged on the vehicle axle.

3. The wheel rotational-speed sensor as claimed in claim 2, wherein the first wheel rotational-speed sensor element and the second wheel rotational-speed sensor element each comprise either i) an AMR sensor element, ii) a GMR sensor element, iii) a TMR sensor element, or iv) a Hall sensor element, for detecting the physical measurement variables.

4. The wheel rotational-speed sensor as claimed in claim 1, wherein the first wheel rotational-speed sensor element and the second wheel rotational-speed sensor element each comprise a magnetic sensor element, for detecting the physical measurement variables.

5. The wheel rotational-speed sensor as claimed in claim 4, wherein the magnetic sensor element and the electrical circuit of each wheel rotational-speed sensor element are mounted on the conductor carrier as separate structural components.

6. The wheel rotational-speed sensor as claimed in claim 4, wherein the first wheel rotational-speed sensor element and the second wheel rotational-speed sensor element each comprise each comprise either i) an AMR sensor element, ii) a GMR sensor element, iii) a TMR sensor element, or iv) a Hall sensor element, for detecting the physical measurement variables.

7. The wheel rotational-speed sensor as claimed in claim 1, wherein the first wheel rotational-speed sensor element and the second wheel rotational-speed sensor element each comprise an electrical circuit for processing the physical measurement variables.

8. The wheel rotational-speed sensor as claimed in claim 7, wherein the magnetic sensor element and the electrical circuit of each wheel rotational-speed sensor element are mounted on the conductor carrier as separate structural components.

9. The wheel rotational-speed sensor as claimed in claim 1, wherein the first wheel rotational-speed sensor element is embodied as structurally identical to the second wheel rotational-speed sensor element, or wherein the magnetic sensor element of the first wheel rotational-speed sensor element and the magnetic sensor element of the second wheel rotational-speed sensor element are of different design.

10. The wheel rotational-speed sensor as claimed in claim 1, wherein the conductor carrier comprises a leadframe, wherein the leadframe is shaped from a metal.

11. The wheel rotational-speed sensor as claimed in claim 1, wherein the first wheel rotational-speed sensor element has a first electrical connection for transmitting the first physical measurement variables, and wherein the second wheel rotational-speed sensor element has a second electrical connection for transmitting the second physical measurement variables.

12. The wheel rotational-speed sensor as claimed in claim 11, wherein the first electrical connection can be connected to a first controller by a first conductor arrangement for transmitting the first physical measurement variables, and wherein the second electrical connection can be connected to a second controller by a second conductor arrangement for transmitting the second physical measurement variables.

13. The wheel rotational-speed sensor as claimed in claim 12, wherein the first controller is designed to detect a first wheel rotational speed on the basis of the first physical measurement variables, and wherein the second controller is designed to detect a second wheel rotational speed on the basis of the second physical measurement variables.

14. The wheel rotational-speed sensor as claimed in claim 13, wherein the first conductor arrangement and the second conductor arrangement are encased at least in sections by a common shell.

15. The wheel rotational-speed sensor as claimed in claim 12, wherein the first conductor arrangement and the second conductor arrangement are encased at least in sections by a common shell.

16. The wheel rotational-speed sensor as claimed in claim 1, wherein the sensor housing is a plastic housing.

17. A fastening system for mounting a wheel rotational-speed sensor on a vehicle axle of a vehicle, wherein the wheel rotational-speed sensor comprises a sensor housing and a conductor carrier, which is arranged in the sensor housing, wherein the conductor carrier has a first surface and a second surface facing away from the first surface, the first surface and the second surface bounded at least in part by an end side of the conductor carrier, wherein a first wheel rotational-speed sensor element for detecting first physical measurement variables is arranged on the first surface of the conductor carrier, and wherein a second wheel rotational-speed sensor element for detecting second physical measurement variables is arranged on the second surface of the conductor carrier, wherein the first wheel rotational-speed sensor element and the second wheel rotational-speed sensor element are arranged on the end side of the conductor carrier, wherein an encoder wheel having a magnetic reading track is also arranged on the vehicle axle; and
wherein the fastening system comprises a fastening adapter, which can be mounted on the vehicle axle, wherein the fastening adapter comprises a receptacle for receiving the sensor housing, wherein the receptacle is designed to align the first wheel rotational-speed sensor element and the second wheel rotational-speed sensor element in the direction of the magnetic reading track in order to detect the respective physical measurement variables.

18. The fastening system as claimed in claim 17, wherein the receptacle is shaped as a recess or aperture in the fastening adapter, and wherein the sensor housing can be inserted into the recess or the aperture.

\* \* \* \* \*